(12) United States Patent
Chang

(10) Patent No.: US 12,482,666 B2
(45) Date of Patent: Nov. 25, 2025

(54) METHOD OF MANUFACTURING SEMICONDUCTOR DEVICE HAVING ISLAND STRUCTURE

(71) Applicant: NANYA TECHNOLOGY CORPORATION, New Taipei (TW)

(72) Inventor: Chen-Cheng Chang, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 729 days.

(21) Appl. No.: 17/847,334

(22) Filed: Jun. 23, 2022

(65) Prior Publication Data

US 2023/0420264 A1 Dec. 28, 2023

(51) Int. Cl.
| | |
|---|---|
| H01L 21/321 | (2006.01) |
| H01L 21/306 | (2006.01) |
| H01L 21/3105 | (2006.01) |
| H01L 21/768 | (2006.01) |
| H01L 23/522 | (2006.01) |
| H10B 12/00 | (2023.01) |

(52) U.S. Cl.
CPC .... *H01L 21/3212* (2013.01); *H01L 21/30625* (2013.01); *H01L 21/31055* (2013.01); *H01L 21/7684* (2013.01); *H01L 23/5226* (2013.01); *H10B 12/01* (2023.02)

(58) Field of Classification Search
CPC ............. H01L 21/7684; H01L 21/3212; H01L 21/31055
See application file for complete search history.

(56) References Cited

U.S. PATENT DOCUMENTS

| | | | |
|---|---|---|---|
| 6,159,786 A | 12/2000 | Chiang et al. | |
| 6,239,020 B1 | 5/2001 | Lou | |
| 6,465,351 B1 | 10/2002 | Jeong | |
| 7,288,487 B1 * | 10/2007 | Kang | ............... H01L 21/76819 |
| | | | 438/723 |
| 10,249,357 B1 | 4/2019 | Lin et al. | |

(Continued)

FOREIGN PATENT DOCUMENTS

| | | |
|---|---|---|
| CN | 112219289 A | 1/2021 |
| CN | 114005845 A | 2/2022 |

(Continued)

OTHER PUBLICATIONS

Office Action and Search Report dated on Mar. 8, 2024 related to Taiwanese Application No. 112103906.

(Continued)

*Primary Examiner* — Jeff W Natalini
*Assistant Examiner* — Jacob Raul Marin
(74) *Attorney, Agent, or Firm* — Xuan Zhang

(57) ABSTRACT

A method for manufacturing a semiconductor device is provided. The method includes: providing a substrate comprising an array region and a peripheral region, wherein the array region and the peripheral region define a stepped structure, performing a deposition process to form a passivation layer over the array region and the peripheral region; performing an etching process to remove a portion of the passivation layer over the array region; and performing a chemical mechanical polishing process so that the passivation layer has a substantially continuous surface over the array region and the peripheral region.

11 Claims, 12 Drawing Sheets

(56) References Cited

U.S. PATENT DOCUMENTS

| | | | |
|---|---|---|---|
| 2002/0127870 A1 | 9/2002 | Kawano | |
| 2009/0280649 A1* | 11/2009 | Mayer | H01L 21/7684 |
| | | | 156/345.23 |
| 2014/0038413 A1* | 2/2014 | Schmidt | H01L 21/304 |
| | | | 438/692 |
| 2015/0147872 A1 | 5/2015 | Leong et al. | |
| 2016/0315094 A1 | 10/2016 | Ishiduki et al. | |
| 2020/0350249 A1 | 11/2020 | Kim et al. | |
| 2022/0199416 A1* | 6/2022 | Zhou | C09G 1/04 |
| 2022/0277964 A1* | 9/2022 | Krishnan | C09G 1/02 |

FOREIGN PATENT DOCUMENTS

| | | |
|---|---|---|
| CN | 114121968 A | 3/2022 |
| EP | 3993037 A1 | 5/2022 |

OTHER PUBLICATIONS

Office Action and and the search report mailed on Dec. 12, 2024 related to U.S. Appl. No. 17/848,243.
Office Action and and the search report mailed on Mar. 21, 2025 related to U.S. Appl. No. 17/848,243.
English Abstracts of foreign patent documents related to CN114005845A.
Office Action and and the search report mailed on Jun. 23, 2025 related to U.S. Appl. No. 17/848,243.

* cited by examiner

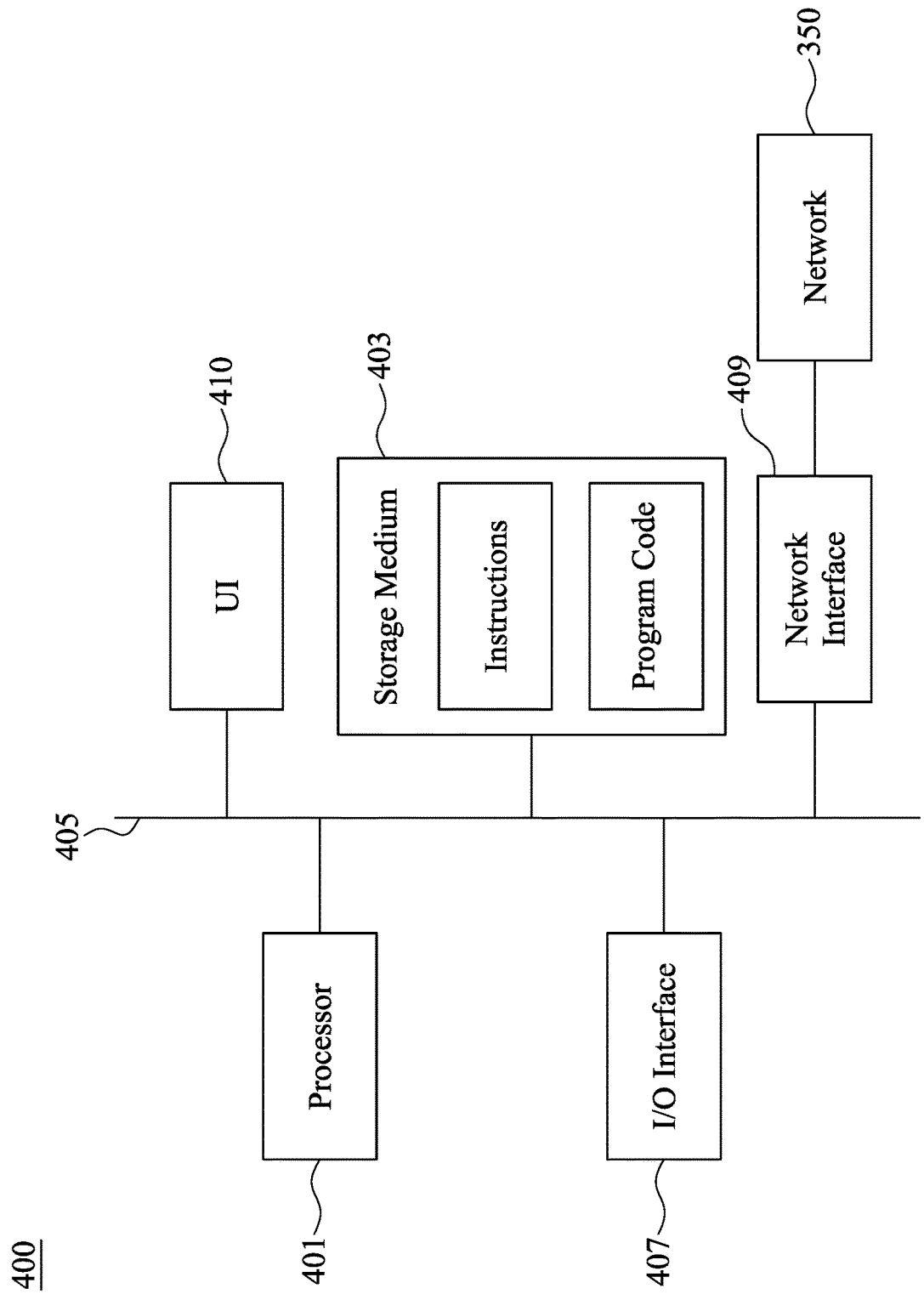

METHOD OF MANUFACTURING SEMICONDUCTOR DEVICE HAVING ISLAND STRUCTURE

TECHNICAL FIELD

The present disclosure relates to a method of manufacturing a semiconductor device, and in particularly to a method of manufacturing a semiconductor device having an island structure.

DISCUSSION OF THE BACKGROUND

With the rapid growth of the electronics industry, the development of integrated circuits (ICs) has achieved high performance and miniaturization. Technological advances in IC materials and design have resulted in repeated evolutions of IC development, each of which provides increasingly smaller and more complex circuits.

A Dynamic Random Access Memory (DRAM) device is a type of random access memory that stores each bit of data in a separate capacitor within an integrated circuit. Typically, a DRAM is arranged in a square array of one capacitor and transistor per cell. A vertical transistor has been developed for the $4F^2$ DRAM cell, where F stands for the photolithographic minimum feature width or critical dimension (CD). However, recently, DRAM manufacturers face the tremendous challenge of shrinking the memory cell area as the word line spacing continues to shrink. For example, an array region and a peripheral region may define a stepped structure, and a passivation may have a height difference between the array region and the peripheral region. When a chemical mechanical polishing process is performed to remove the passivation layer, a difference of an amount of the removed passivation layer between the array region and the peripheral region may cause chemical mechanical polishing equipment to deteriorate, enhancing the cost of manufacturing a semiconductor device.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a method for manufacturing a semiconductor device. The method includes providing a substrate comprising an array region and a peripheral region, wherein the array region and the peripheral region define a stepped structure, performing a deposition process to form a passivation layer over the array region and the peripheral region; performing an etching process to remove a portion of the passivation layer over the array region; and performing a chemical mechanical polishing process so that the passivation layer has a substantially continuous surface over the array region and the peripheral region.

Another aspect of the present disclosure provides a method for manufacturing a semiconductor device. The method includes: providing a substrate comprising an array region and a peripheral region, wherein the array region and the peripheral region define a stepped structure with a first height difference (H1), performing a deposition process to form a passivation layer over the peripheral region with a first thickness (T1) and over the array region with a second thickness (T2), performing a chemical mechanical polishing process to remove a portion of the passivation layer so that the passivation layer has a third thickness (T3) over the array region, wherein the H1, the T1, the T2, and the T3 satisfy an equation (1):

$$(T1-H1-T3)\times 3 < T2-T3 < (T1-H1-T3)\times 7.$$

Another aspect of the present disclosure provides a method for manufacturing a semiconductor device. The method includes: providing a substrate comprising an array region and a peripheral region, wherein the array region and the peripheral region define a stepped structure, performing a deposition process to form a passivation layer over the array region and the peripheral region, wherein the passivation layer has a first thickness (T1) over the peripheral region, and the T1 ranges from about 2000 nm to about 2800 nm, and performing a chemical mechanical polishing process so that the passivation layer has a substantially continuous surface over the array region and the peripheral region, wherein the substantially continuous surface of the passivation layer has a surface roughness with a maximum height less than about 80 nm.

The embodiments of the present disclosure provide a method of manufacturing a semiconductor device. The method includes forming a passivation over the array region and the peripheral region of a substrate. A chemical mechanical polishing process is performed to remove the passivation layer, wherein the amount of passivation layer removed by the chemical mechanical polishing process and the amount of passivation layer deposited satisfies a specific equation. When process parameters satisfy the aforesaid equation, uniformity of the substrate is improved. Further, the polishing pad of chemical mechanical polishing process equipment deteriorates at a much slower rate, reducing manufacturing costs.

The foregoing outlines rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

FIG. 6 is a diagram illustrating hardware of a semiconductor fabrication system, in accordance with various aspects of the present disclosure.

DETAILED DESCRIPTION

Figure 1:
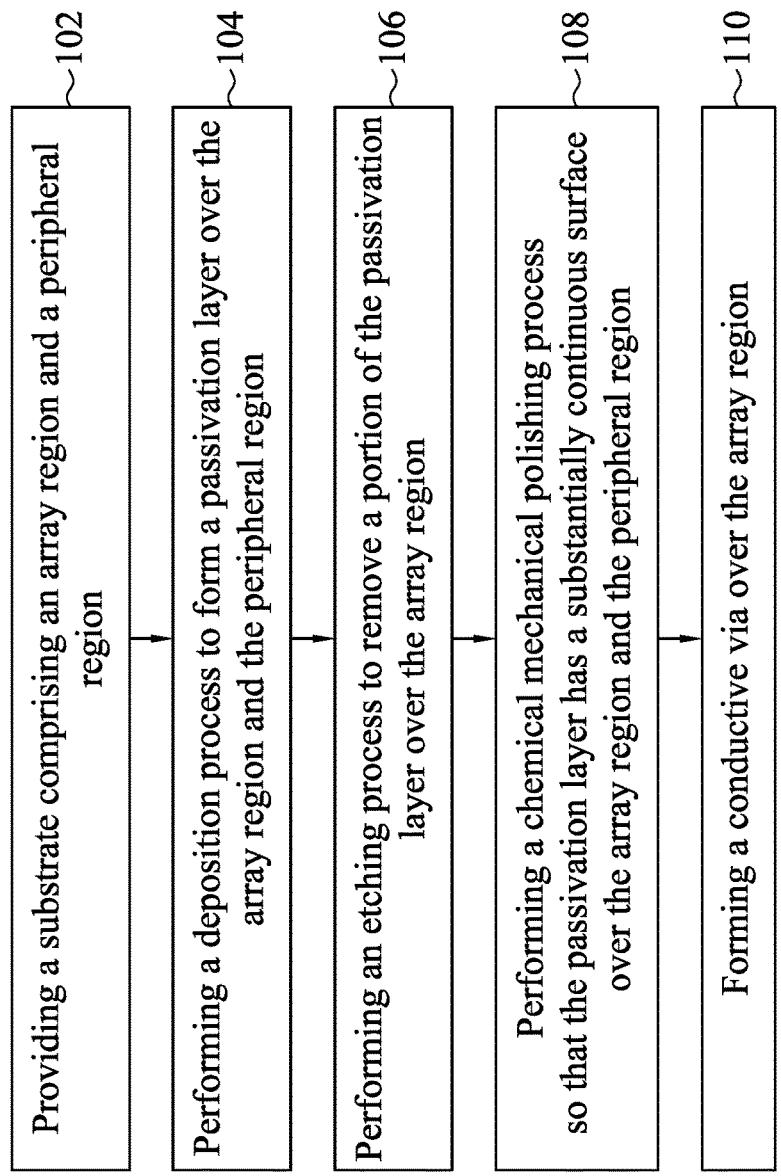
FIG. 1 is a schematic chart illustrating a method of manufacturing a semiconductor device, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that when an element is referred to as being "connected to" or "coupled to" another element, the initial element may be directly connected to, or coupled to, another element, or to other intervening elements.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

It should be noted that the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. In yet another aspect, the term "about" means within 9, 8, 7, 6, 5, 4, 3, 2, or 1% of the reported numerical value.

FIG. 1 is a schematic chart illustrating a method 100 of manufacturing a semiconductor device, in accordance with some embodiments of the present disclosure.

The method 100 can be applied to manufacture a semiconductor device including active components and passive components. The active component may include a memory device (e.g., dynamic random access memory (DRAM) device, a static random access memory (SRAM) device, etc.)), a power management device (e.g., power management integrated circuit (PMIC) device)), a logic device (e.g., system-on-a-chip (SoC), central processing unit (CPU), graphics processing unit (Gap, application processor (AP), microcontroller, etc.)), a radio frequency (RF) device, a sensor device, a micro-electro-mechanical-system (MEMS) device, a signal processing device (e.g., digital signal processing (DSP) device)), a front-end device (e.g., analog front-end (AFE) devices)) or other active components. The passive component may include a capacitor, a resistor, an inductor, a fuse or other passive components.

For example, the method 100 can be applied to manufacture a memory, memory device, memory die, memory chip, or other components. For example, the method 100 can be applied to manufacture a portion of memory, memory device, memory die, or memory chip. For example, the memory can be a DRAM. In some embodiments, the DRAM can be a double data rate fourth generation (DDR4) DRAM. In some embodiments, the memory includes one or more memory cells (or memory bits, memory blocks).

The method 100 can begin with operation 102 in which a substrate is provided. In some embodiments, the substrate can include array regions and peripheral regions. In some embodiments, the array region can be referred to a capacitor region. In some embodiments, the array region can include at least a capacitor, a word line structure, and a bit line structure. The peripheral region can include a gate structure. In other embodiments, the term "array region" can refer to a region on which pillar structures are disposed. In some embodiments, the term "peripheral region" can refer to a region on which no pillar structures are disposed. In some embodiments, the term "peripheral region" can refer to a region on which no capacitors are disposed. In some embodiments, a portion of the peripheral region can serve as a scribe line. In some embodiments, a gate structure or conductive traces can be formed on the peripheral region of the substrate. In some embodiments, the array region and the peripheral region can define a stepped structure. An island structure can be formed on the array region. In some embodiments, the method can include providing a first substrate having a first island structure and a second substrate having a second island structure. The thickness of the first island structure can be different from the thickness of the second island structure.

The method 100 can continue with operation 104 in which a deposition process is performed to form a passivation layer on the array region and the peripheral region. In some embodiments, the passivation layer can cover the island structure. In some embodiments, the passivation layer can have a first top surface on the peripheral region and a second top surface on the array region. The second top surface can have an elevation higher than an elevation of the first top surface.

The method 100 can continue with operation 106 in which an etching process is performed. The etching process can be utilized to remove a portion of the passivation layer on the array region. In some embodiments, a recess can be formed and recessed from the second top surface of the passivation layer. In some embodiments, the bottom of the recess can have an elevation substantially the same as that of the first top surface of the passivation layer. In some embodiments, the bottom of the recess can have an elevation exceeding that of the first top surface of the passivation layer. In some embodiments, the passivation layer on the peripheral region remains following etching. In some embodiments, the etching process can include dry etching.

The method 100 can continue with operation 108 in which a chemical mechanical polishing process is performed so that the passivation layer has a substantially continuous surface over the array region and the peripheral region. In some embodiments, the amount of the passivation layer removed by the chemical mechanical polishing process can depend on the thickness of the passivation layer deposited by the deposition process. In some embodiments, the amount of the passivation layer removed by the chemical mechanical polishing process can depend on a depth (or a height difference) of the recess of the passivation layer removed by the etching process. In some embodiments, the amount of the passivation layer removed by the chemical mechanical polishing process can depend on the thickness of the island structure over the array region. In some embodiments, the amount of the passivation layer removed by the chemical mechanical polishing process can determine the polishing time of the chemical mechanical polishing process.

The method 100 can continue with operation 110 in which a conductive via is formed within the passivation layer over the array region, thereby producing a semiconductor device.

The method 100 is merely an example, and is not intended to limit the present disclosure beyond what is explicitly recited in the claims. Additional operations can be provided before, during, or after each operation of the method 100, and some operations described can be replaced, eliminated, or reordered for additional embodiments of the method. In some embodiments, the method 100 can include further operations not depicted in FIG. 1. In some embodiments, the method 100 can include one or more operations depicted in FIG. 1.

Figure 2:
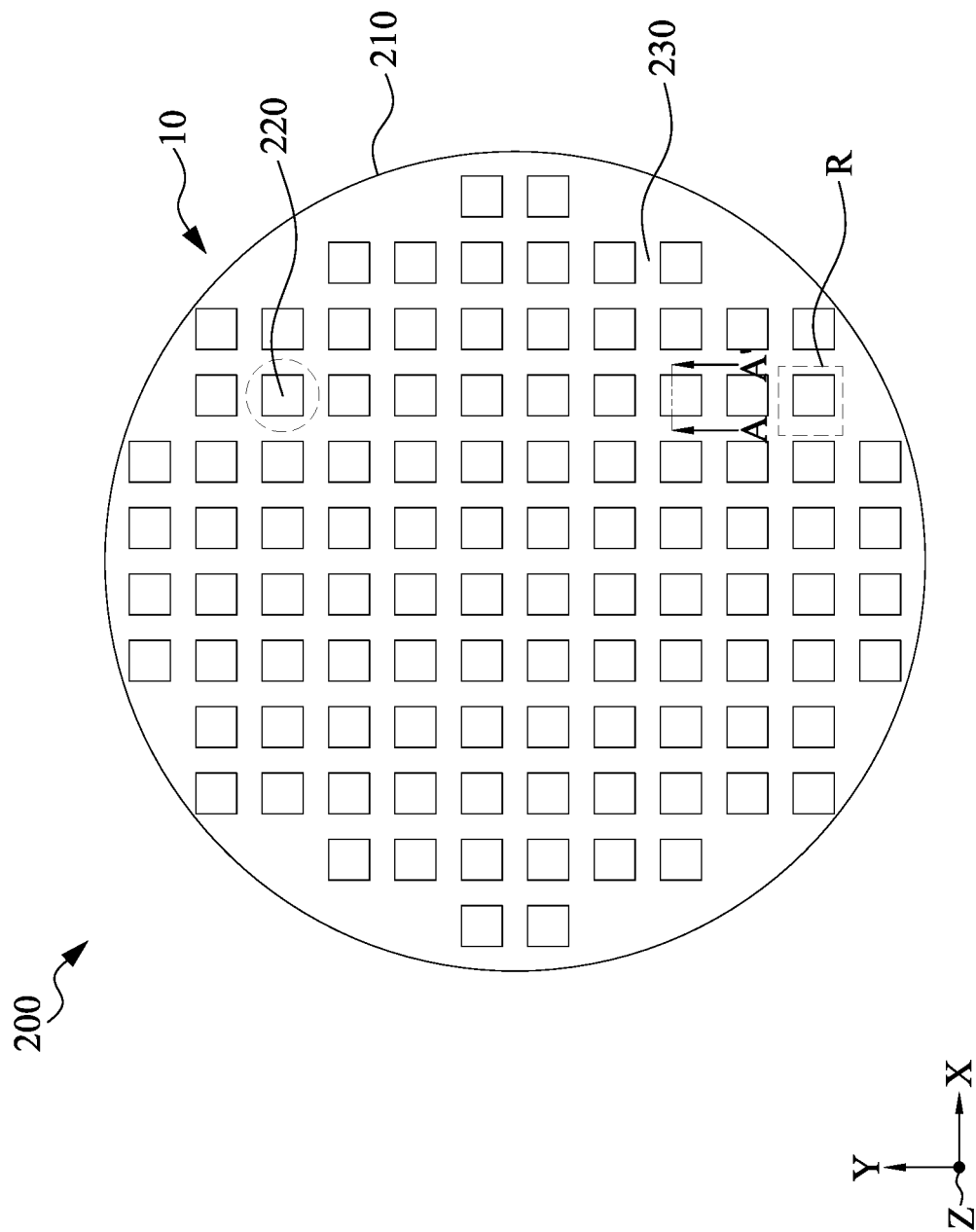
FIG. 2 is a top view of a semiconductor device, in accordance with some embodiments of the present disclosure.
Figure 3:
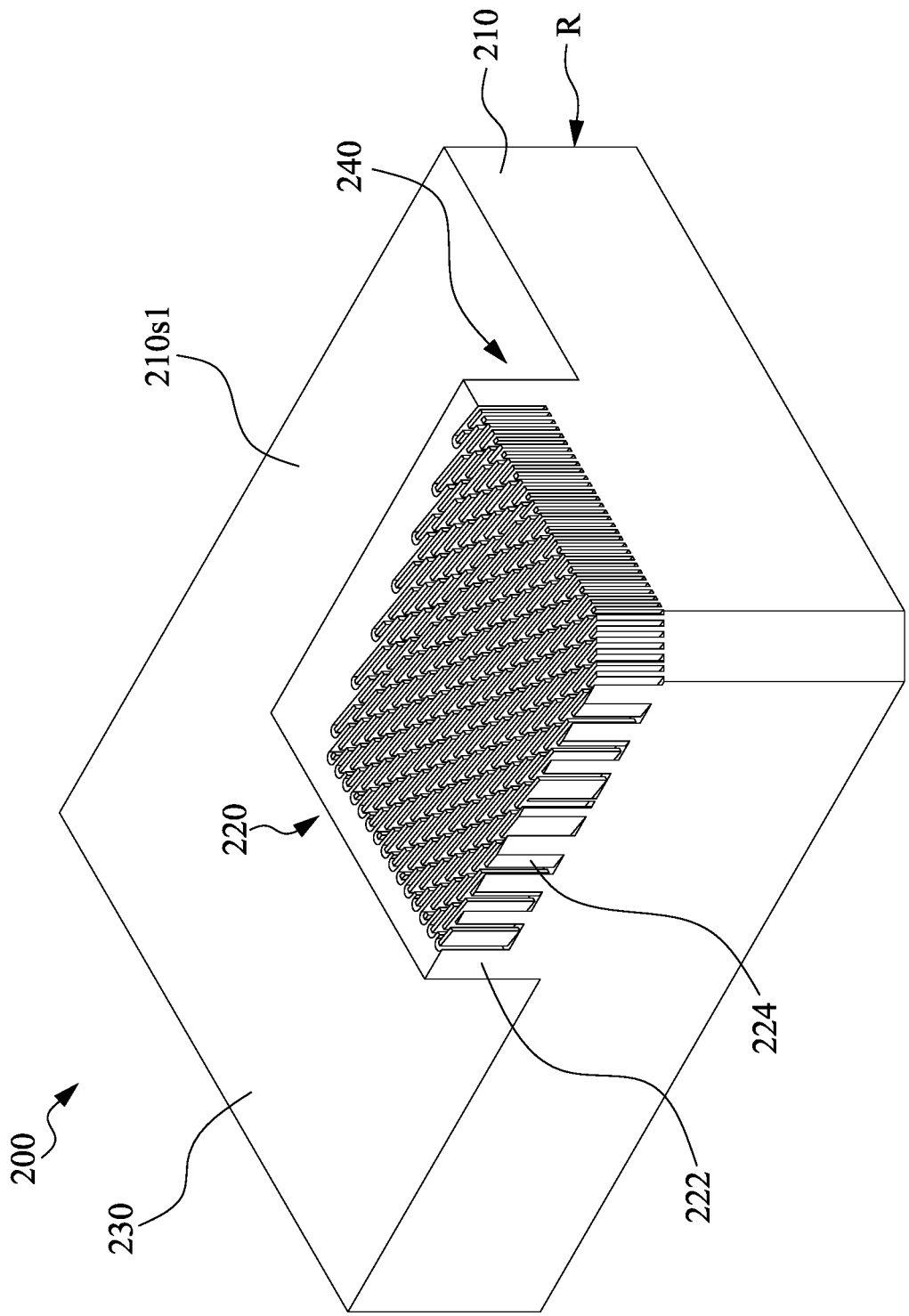
FIG. 3 is a perspective view of the semiconductor device shown in FIG. 2, in accordance with some embodiments of the present disclosure.

Referring to FIG. 2 and FIG. 3, FIG. 2 is a top view of semiconductor device 200 according to various aspects of the present disclosure, and FIG. 3 is a perspective view of a region R of the semiconductor device 200 as shown in FIG. 2.

As shown in FIG. 2 and FIG. 3, the semiconductor device 200 can include a substrate 210. In some embodiments, the substrate 210 can include a plurality of array regions 220. The substrate 210 can include a peripheral region 230 surrounding the array region 220.

The substrate 210 may be a semiconductor substrate, such as a bulk semiconductor, a semiconductor-on-insulator (SOI) substrate, or the like. The substrate 210 can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide, an alloy semiconductor material including at least one of SiGe, GaAsP, AlInAs, AlGaAs, GaInAs, GaInP, and GaInAsP, any other suitable material, or a combination thereof. In some embodiments, the alloy semiconductor substrate may include a SiGe alloy with a gradient Ge feature in which the Si and Ge composition changes from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy. In some embodiments, the substrate 210 may have a multilayer structure, or the substrate 210 may include a multilayer compound semiconductor structure.

As shown in FIG. 3, an island structure 222 can be formed on the array region 220. In some embodiments, the array region 220 and the peripheral region 230 can define a stepped structure 240. The island structures 222 can protrude from the substrate 210. In some embodiments, the island structure 222 and the top surface 210s1 of the substrate 210 can define a stepped structure 240.

In some embodiments, the island structure 222 can include a plurality of pillar structures 224 covered by a capping layer. In some embodiments, a memory device or a part of a memory device can be formed within the array region 220. In some embodiments, a memory device or a part of a memory device can be formed within the pillar structures 224. In some embodiments, each of the pillar structures 224 can include a field effect vertical transistor and at least one capacitor. In some embodiments, each of the pillar structures 224 can be covered by a capping layer, which is made of dielectric materials. The pillar structure 224 can further include other components. For example, the pillar structure 224 can include a word line and a bit line and other components. During a read operation, a word line can be asserted, turning on a transistor. The enabled transistor allows the voltage across a capacitor to be read by a sense amplifier through a bit line. During a write operation, the data to be written can be provided on the bit line when the word line is asserted.

Figure 4A:
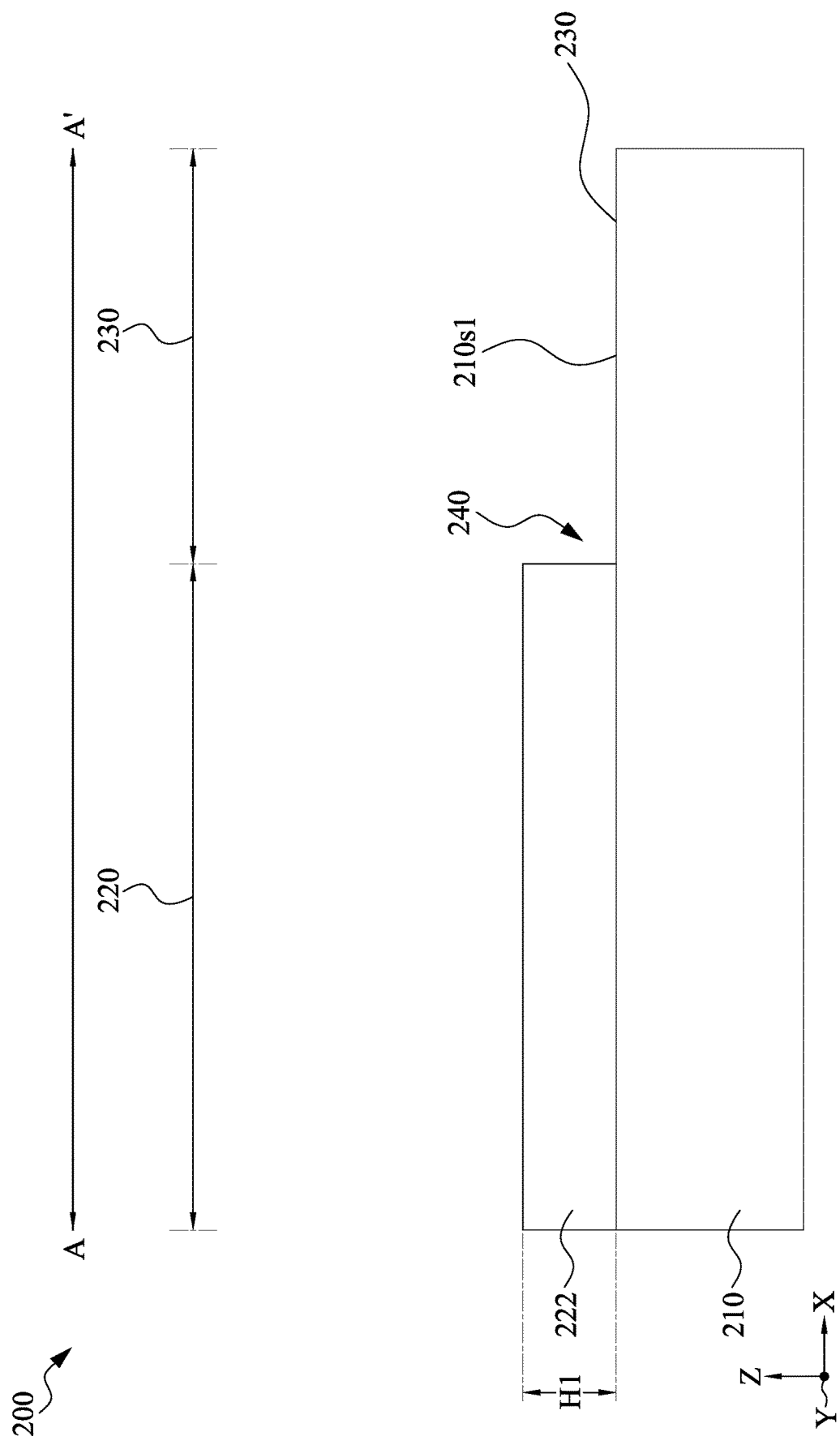
FIG. 4A, FIG. 4B, FIG. 4C, FIG. 4D, and FIG. 4E illustrate one or more stages of an exemplary method for manufacturing a semiconductor device according to some embodiments of the present disclosure.

FIG. 4A, FIG. 4B, FIG. 4C, FIG. 4D, and FIG. 4E illustrate one or more stages of an exemplary method for manufacturing a semiconductor device 200 according to some embodiments of the present disclosure. FIG. 4A depicts a stage corresponding to that depicted in FIG. 3. The cross-sectional views shown in FIG. 4A, FIG. 4B, FIG. 4C, FIG. 4D, and FIG. 4E can correspond to a cross-section along line A-A' shown in FIG. 2.

Referring to FIG. 4A, a substrate 210 can be provided. The substrate 210 can include an array region 220 and a peripheral region 230. The island structures 222 can be disposed in or over the array region 220. In some embodiments, the island structures 222 and the top surface 210s1 of the substrate 210 can define a stepped structure 240. In some embodiments, the stepped structure 240 have a height difference H1. That is, the thickness of the island structures 222 can equal H1. In some embodiments, the height difference H1 can range from about 1200 nm to about 2000 nm, such as 1200 nm, 1300 nm, 1400 nm, 1500 nm, 1600 nm, 1700 nm, 1800 nm, 1900, or 2000 nm.

Figure 4B:
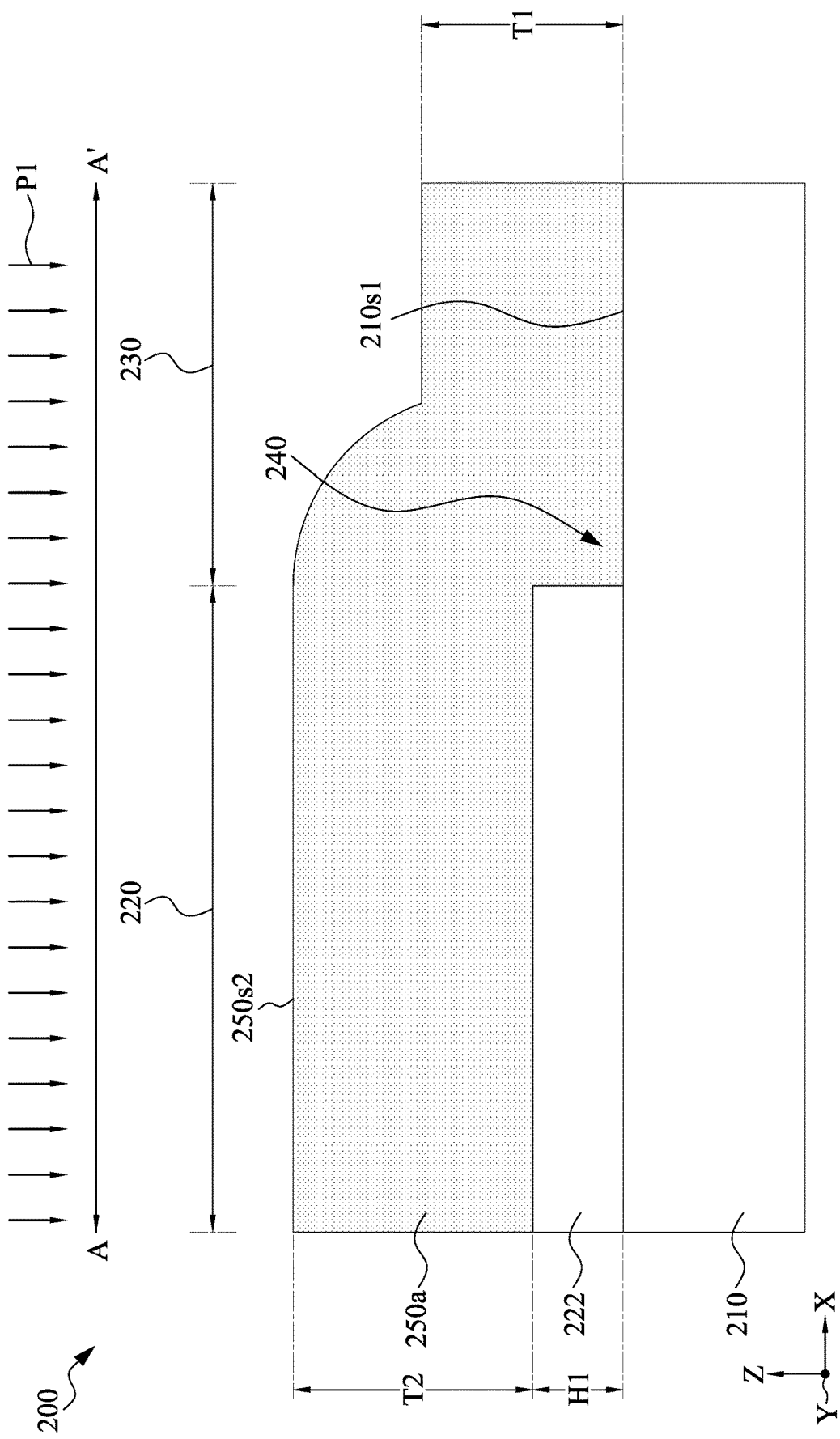

Referring to FIG. 4B, a deposition process P1 can be performed to form a passivation layer 250a. In some embodiments, the deposition process P1 can include chemical vapor deposition (CVD), atomic layer deposition (ALD), physical vapor deposition (PVD), low-pressure chemical vapor deposition (LPCVD) and plasma-enhanced CVD (PECVD), or other suitable processes. The passivation layer 250a can have a surface 250s1 over the peripheral region 230 with a thickness T1. In some embodiments, the thickness T1 can range from about 2000 nm to about 2800 nm, such as 2000 nm, 2100 nm, 2200 nm, 2300 nm, 2400 nm, 2500 nm, 2600 nm, 2700 nm, or 2800 nm.

The passivation layer 250a can have a surface 250s2 over the array region 220 with a thickness T2. The stepped structure 240 can result in the passivation layer 250a having varying thicknesses over the array region 220 and over the peripheral region 230. In some embodiments, the thickness T2 can be different from the thickness T1. In some embodiments, the thickness T2 can exceed the thickness T1. In some embodiments, the thickness T2 can range from about 2100 nm to about 3100 nm, such as 2100 nm, 2200 nm, 2300 nm, 2400 nm, 2500 nm, 2600 nm, 2700 nm, 2800 nm, 2900 nm, 3000 nm, or 3100 nm.

In some embodiments, the difference between the thicknesses T1 and T2 can depend on the height difference H1 of the stepped structure 240. In some embodiments, the difference between the thicknesses T1 and T2 can range from about 100 nm to about 300 nm, such as 100 nm, 120 nm, 140 nm, 160 nm, 180 nm, 200 nm, 220 nm, 240 nm, 260 nm, 280 nm, or 300 nm. In some embodiments, when the height difference H1 ranges from about 1200 nm to about 2000 nm, the difference between the thicknesses T1 and T2 can be estimated to be approximately 200 nm. That is, the thickness T2 can equal the thickness T1 plus 200 nm.

Figure 4C:
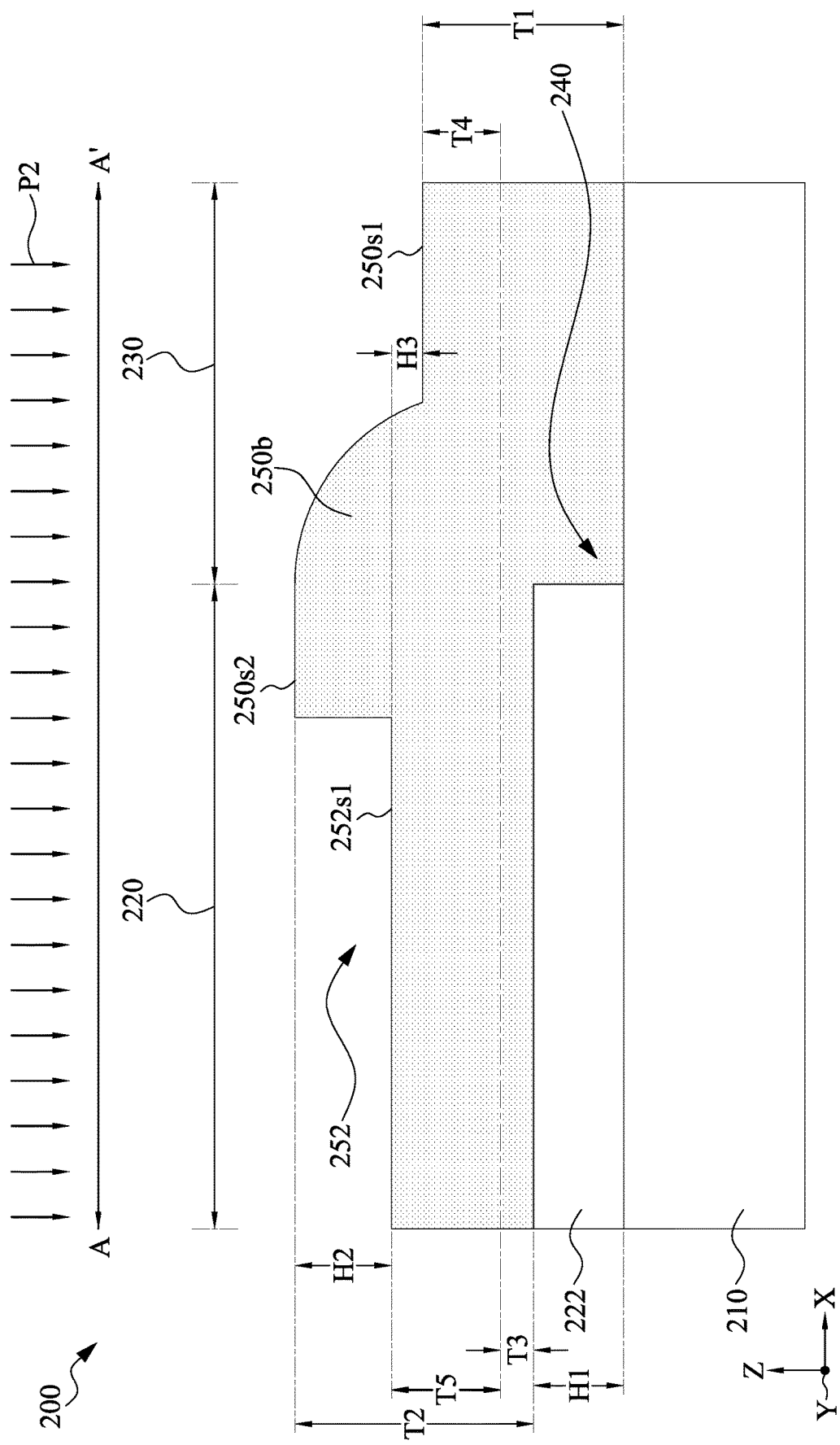

Referring to FIG. 4C, an etching process P2 can be performed. In some embodiments, the etching process P2 can include an anisotropic etching process. In some embodiments, the etching process P2 can include a dry etching process. In some embodiments, the etching process P2 can be utilized to form a recess 252 over the array region 220. In some embodiments, the passivation layer 250b over the peripheral region 230 can be free from being removed by the etching process P2. In some embodiments, the passivation layer 250b over the peripheral region 230 remains following etching P2.

In some embodiments, the recess 252 can be recessed from the surface 250s2 of the passivation layer 250b. In some embodiments, the recess 252 can be free from vertically overlapping a lateral surface island structures 222s1 of the array region 220. In some embodiments, the recess 252 can be free from vertically overlapping the peripheral region 230.

In some embodiments, the surface 252s1 of the recess 252 and the surface 250s2 of the passivation layer 250b can define a height difference H2. In some embodiments, the surface 252s1 can be defined as a bottom surface or an under side of the recess 252. In some embodiments, the height difference H2 can depend on the thickness T2. In some embodiments, the height difference H2 can depend on a thickness T3, which is a predetermined height of the passivation layer 250c in the subsequent process. In some embodiments, the height difference H2 can range from about 800 nm to about 1400 nm, such as 800 nm, 900 nm, 1000 nm, 1100 nm, 1200 nm, 1300 nm, or 1400 nm.

In some embodiments, the height difference H2 can depend on the thickness T1. In some embodiments, the height difference H2 can range from about 0.3 times and about 0.7 times of the thickness T1, such as 0.3 times, 0.35 times, 0.4 times, 0.45 times, 0.5 times, 0.55 times, 0.6 times, 0.65 times or 0.7 times of the thickness T1. When height difference H2 is within the aforesaid range, the passivation layer 250b can have a relatively smooth surface after chemical mechanical polishing process.

In some embodiments, the surface 252s1 of the recess 252 can have an elevation substantially the same as that of the surface 250s1. In some embodiments, the surface 252s1 of the recess 252 can have an elevation exceeding that of the surface 250s1. In some embodiments, the surface 252s1 of the recess 252 and the surface 250s1 of the passivation layer 250c can define a height difference H3. The height difference H3 can range from about 0 to about 600 nm, such as 0, 60 nm, 120 nm, 180 nm, 240 nm, 300 nm, 360 nm, 420 nm, 480 nm, 540 nm, or 600 nm. When height difference H3 is within the aforesaid range, the passivation layer 250c can have a relatively smooth surface after chemical mechanical polishing process.

Figure 4D:
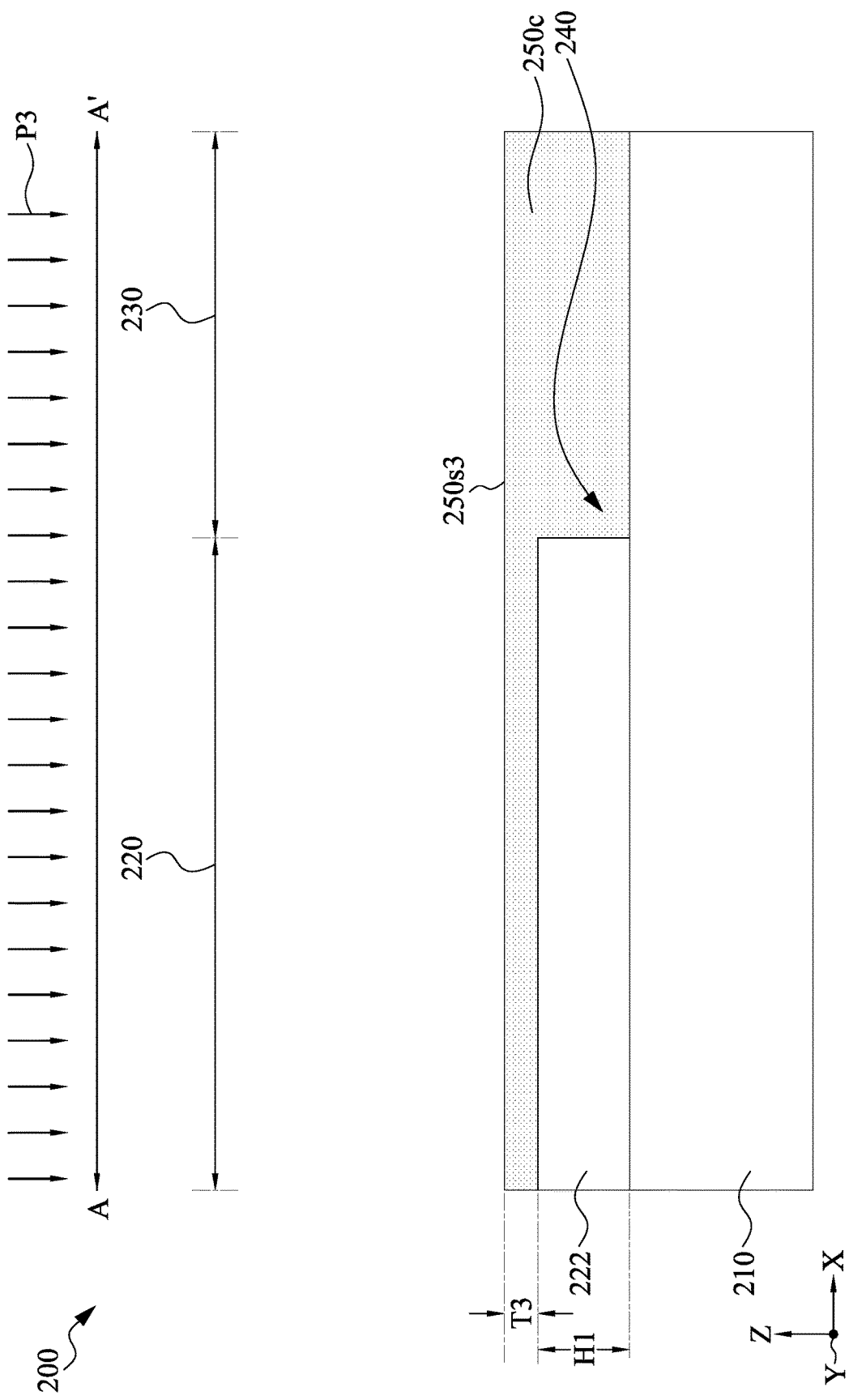

Referring to FIG. 4D, a chemical mechanical polishing process P3 can be performed. The passivation layer 250b over the array region 220 and the peripheral region 230 can be removed to form a surface 250s3. In some embodiments, the surface 250s3 of the passivation layer 250c can be a substantially continuous surface extending from over the array region 220 to over the peripheral region 230. As used herein, the term "continuous surface" can refer to a surface without a step with height difference exceeding about 30 nm. More specifically, the term "continuous surface" can refer to a step with a lateral surface that has an angle greater than 60°, 70°, 80° or more relative to the normal direction of the surface 250s3 of the passivation layer 250c.

In some embodiments, the surface 250s3 of the passivation layer 250c can have a roughness with a maximum height less than about 80 nm, such as 80 nm, 70 nm, 60 nm, 50 nm, 40 nm, 30 nm, 20 nm, 10 nm, 5 nm, or 0. As used herein, the term "roughness with a maximum height" may refer to an absolute vertical distance between the maximum profile peak height and the maximum profile valley depth along the Z-axis.

A slurry can be used when performing the chemical mechanical polishing process P3. In some embodiments, the slurry can include an abrasive, an oxidizing agent, a stabilizer, a dishing reducing additive, a solvent, an activator, and other agents.

The abrasive can include metal oxide, a metalloid oxide, or a chemical mixture of metal oxides and metalloid oxides. Suitable metal oxide abrasives include, but are not limited to, alumina, ceria, germania, silica, spinel, titania, an oxide or nitride of tungsten, zirconia, any one there doped with one or more other minerals or elements, or any combination thereof. Suitable metal oxide abrasives may be produced by any of a variety of techniques, including sol-gel, hydrothermal, hydrolytic, plasma, pyrogenic, aerogel, fuming and precipitation techniques, or any combination thereof.

The oxidizing agent can include an inorganic or organic per-compound. A per-compound, as used herein, is defined as a compound containing an element in its highest state of oxidation, such as perchloric acid, or a compound containing at least one peroxy group (—O—O—), such as peracetic acid and perchromic acid. Suitable per-compounds containing at least one peroxy group include, but are not limited to, peracetic acid or salt thereof, a percarbonate, and an organic peroxide, such as benzoyl peroxide, urea hydrogen peroxide, and/or di-t-butyl peroxide.

The stabilizer can be selected from the group consisting of an organic acid selected from the group consisting of adipic acid, phthalic acid, citric acid, malonic acid and orthophthalic acid, phosphoric acid, substituted or unsubstituted phosphonic acid, phosphonate compound, nitrile, a ligand which can bind the activator material and thus reduce reactions that degrade the oxidizing agent, and combinations thereof.

The dishing reducing additive can be selected from the group consisting of sarcosinate and related carboxylic compounds, hydrocarbon substituted sarcosinate, amino acids, organic polymers and copolymers having molecules containing ethylene oxide repeating units, such as polyethylene oxide (PEO), ethoxylated surfactants, nitrogen containing heterocycles without nitrogen-hydrogen bonds, sulfide, oxazolidine or mixture of functional groups in one compound, nitrogen containing compounds having three or more carbon atoms that form alkylammonium ions, amino alkyls having three or more carbon atoms, polymeric corrosion inhibitors comprising a repeating group of at least one nitrogen-containing heterocyclic ring or a tertiary or quaternary nitrogen atom, polycationic amine compound, cyclodextrin compound, polyethyleneimine compound, glycolic acid, chitosan, sugar alcohols, polysaccharides, alginate compound, phosphonium compound, and sulfonic acid polymer.

The solvent can include, but is not limited to, water, a polar solvent selected from the group consisting of alcohol, ether, ketone, other polar reagent and combinations thereof, and a mixture of water and polar solvent. "Other polar reagents" as referred to herein include, but are not limited to, glycols and organic acids. The concentration of solvent in the composition is 90% by weight or more of the composition.

The activator can include a material that facilitates the formation of free radicals by having at least one free radical-producing compound present in the fluid. If the activator is a metal ion, or metal-containing compound, it is in a thin layer associated with a surface of a solid which contacts the fluid. In some embodiments, the activator can include metal-containing activator compounds. The metal-containing activator compounds can be used in the form of a soluble compound in the slurry. Suitable activator compounds for the pH range of this invention include, but are not limited to, ammonium iron (III) oxalate trihydrate, iron (III) nitrate and hydrates thereof, iron (III) citrate tribasic monohydrate, iron (11) acetylacetonate and ethylenediaminetetraacetic acid, iron (III) sodium salt hydrate. A soluble activator can also be a metal compound of Ag, Co, Cr, Cu, Fe, Mo, Mn, Nb, Ni, Os, Pd, Ru, Sn, Ti, V and mixtures thereof having multiple oxidation states.

After the chemical mechanical polishing process P3 is performed, the passivation layer 250c can have a thickness T3 over the array region 220. In some embodiments, the thickness T3 can range from about 200 nm to about 300 nm, such as 200 nm, 210 nm, 220 nm, 230 nm, 240 nm, 250 nm, 260 nm, 270 nm, 280 nm, 290 nm, or 300 nm.

In some embodiments, the polishing time of the chemical mechanical polishing process P3 can range from about 120 seconds to about 160 seconds, such as 120 seconds, 125 seconds, 130 seconds, 135 seconds, 140 seconds, 145 seconds, 150 seconds, 155 seconds, or 160 seconds. When the polishing time of the chemical mechanical polishing process P3 is within the aforesaid range, the erosion mean, erosion range, and roughness of the surface 250s3 of the passivation layer 250c can be improved.

In some embodiments, during the chemical mechanical polishing process P3, the removed thickness T4 (shown in FIG. 4C) of the passivation layer 250c over the peripheral region 230 can satisfy following equation (1):

$$T4=T1-H1-T3$$

In some embodiments, the thickness T4 can be regarded an amount of the removed passivation layer 250b over the peripheral region 230. In some embodiments, the thickness T4 can depend on the height difference H1. In some embodiments, the thickness T4 can depend on the thickness T1. In some embodiments, the thickness T4 can depend on the thickness T2. In some embodiments, the thickness T4 can depend on the thickness T3. In some embodiments, T4, T2, and T3 can satisfy following equation (2):

$$T4 \times 3 < T2-T3 < T4 \times 7$$

In some embodiments, T1, T3, and H1 can satisfy following equation (3):

$$(T1-H1-T3) \times 3 < T2-T3 < (T1-H1-T3) \times 7$$

In some embodiments, T1, T3, and H1 can satisfy following equation (4):

$$(T1-H1-T3) \times 3 < T1-T3+200 \text{ nm} < (T1-H1-T3) \times 7$$

Since the thickness T3 and the height difference H1 can be predetermined, a minimum and a maximum of the thickness T1 can be obtained from equation (4).

For example, when height difference H1 is 1400 nm and the thickness T3 is 250 nm, the minimum of the thickness T1 is about 1916 nm, and the maximum of the thickness T1 is about 2450 nm.

When height difference H1 is 1700 nm and the thickness T3 is 250 nm, the minimum of the thickness T1 is about 2266 nm, and the maximum of the thickness T1 is about 2900 nm.

When the minimum of the thickness T1 satisfies the equation (4), the island structures 222 of the array region 220 can be protected from removal by the chemical mechanical polishing process P3. When the maximum of the thickness T1 satisfies the equation (4), the polishing time of the chemical mechanical polishing process can be within a rational time interval, preventing the polishing pad of chemical mechanical polishing process equipment from deteriorating as quickly.

Further, when semiconductor devices 100 have different substrates (or products) with height differences H1 of the stepped structure 240, the thickness T1 that satisfies both products can be obtained from equation (4). For example, when height differences H1 of two semiconductor devices 100 are 1400 nm and 1700 nm, the thickness T1 of the passivation layer 250c can range from 2266 nm to about 2450 nm. That is, the process conditions shown in FIG. 4B to FIG. 4D can be applied to aforesaid products with different differences H1, and the aforesaid products can be performed by the same equipment with the same recipe, thereby improving the performance of fabrication equipment.

In some embodiments, during the etching process P2, the removed thickness T5 (shown in FIG. 4C) of the passivation layer 250c over the array region 220 can satisfy following equation (5):

$$T5=T2-H2-T3$$

In some embodiments, the thickness T5 can be regarded an amount of the removed passivation layer 250b over the array region 220. In some embodiments, the height difference H2 can depend on the thickness T5. In some embodiments, the height difference H2 can depend on the thickness T2. In some embodiments, the height difference H2 can depend on the thickness T3. In some embodiments, T2, T3, T5, and H2 can satisfy following equation (6):

$$(T2-H2-T3) \times 1 < H2 < (T2-H2-T3) \times 2$$

Since the thickness T3 is predetermined and the thickness T2 can be determined by the equation (4), a minimum and a maximum of the height difference H2 can be obtained from equation (6). For example, when the thickness T2 is 2400 nm and the thickness T3 is 250 nm, the minimum of the height difference H2 is about 1075 nm, and the maximum of the height difference H2 is about 1433 nm.

When the minimum of the height difference H2 satisfies the equation (6), the polishing time of the chemical mechanical polishing process can be within a rational time interval, preventing the polishing pad of chemical mechanical polishing process equipment from deteriorating as quickly. When the maximum of the height difference H2 satisfies the formula (6), the island structures 222 of the array region 220 can be protected from removal by the chemical mechanical polishing process P3.

Figure 4E:
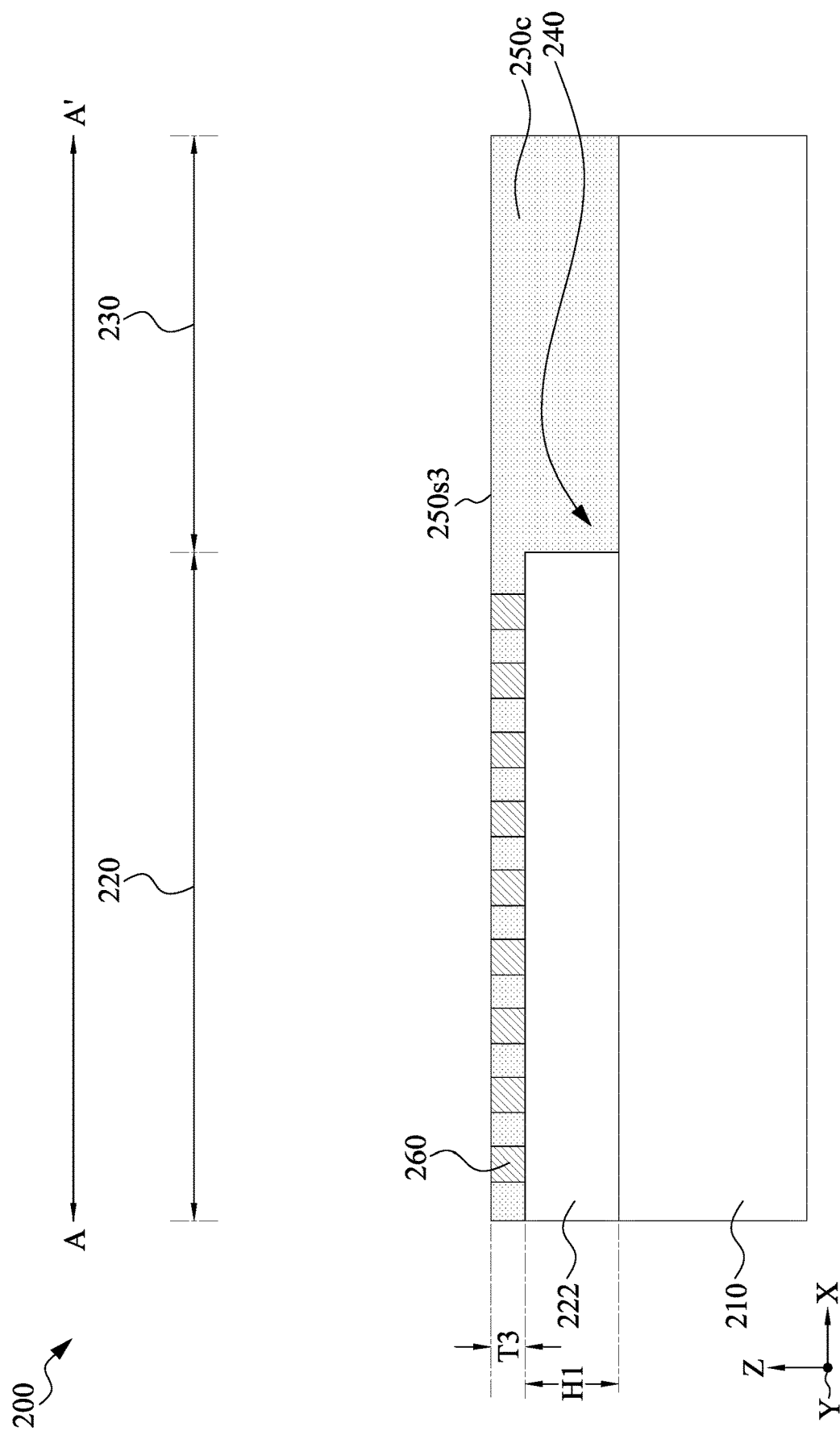

Referring to FIG. 4E, a plurality of the conductive features 260 can be formed within the passivation layer 250c. Each of the conductive features 260 can be electrically coupled to the island structures 222. Each of the conductive features 260 can be electrically coupled to the transistor of the island structure 222. In some embodiments, the conductive feature 260 can include conductive materials, such as tungsten (W), copper (Cu), aluminum (Al), tantalum (Ta), molybdenum (Mo), tantalum nitride (TaN), titanium, titanium nitride (TiN), the like, and/or a combination thereof.

Figure 5A:
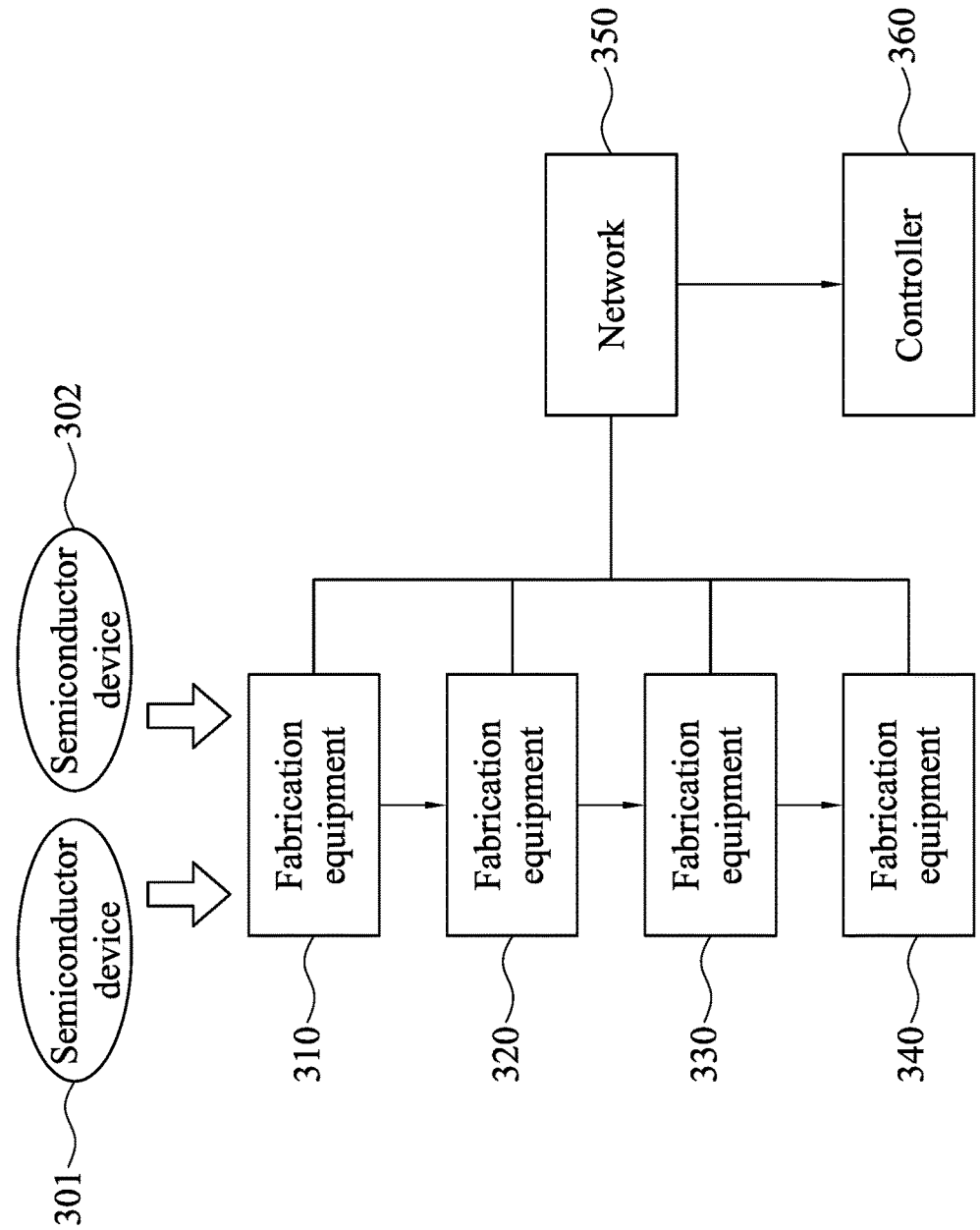
FIG. 5A is a block diagram illustrating a semiconductor fabrication system, in accordance with some embodiments of the present disclosure.

FIG. 5A is a block diagram illustrating a semiconductor fabrication system 300, in accordance with some embodiments of the present disclosure.

The semiconductor fabrication system 300 can include fabrication equipment 310, 320 330, and 340. Each of the fabrication equipment 310, 320 330, and 340 can be coupled with a controller 360 through a network 350.

The fabrication equipment 310 can perform the deposition process P1 shown in FIG. 4B. In some embodiments, the fabrication equipment 310 may be used to form a dielectric layer (e.g., the passivation layer 250c) or other suitable films. In some embodiments, the fabrication equipment 310 can be utilized to perform a chemical vapor deposition (CVD), an atomic layer deposition (ALD), a physical vapor deposition (PVD), a low-pressure chemical vapor deposition (LPCVD), a plasma-enhanced CVD (PECVD), or other suitable processes. In some embodiments, measurement equipment (not shown) can be utilized to measure the thickness T1 and/or T2 of the passivation layer 250a as shown in FIG. 4B.

The fabrication equipment 320 can be used to perform the etching process P2 shown in FIG. 4C. In some embodiments, the fabrication equipment 320 may be used to remove a portion of a film (e.g., the passivation layer 250a) or other suitable films. In some embodiments, the fabrication equipment 320 can be utilized to perform a dry etching process. In some embodiments, measurement equipment (not shown) can be utilized to measure the height difference H2 of the recess 252 as shown in FIG. 4C.

The fabrication equipment 330 can be used to perform the chemical mechanical polishing process P3 shown in FIG. 4D. In some embodiments, the fabrication equipment 330 may be used to polish a film (e.g., the passivation layer 250c) to form a substantial continuous surface (e.g., the surface 250s3). In some embodiments, the fabrication equipment 330 can be utilized to perform a chemical mechanical polishing process. In some embodiments, measurement equipment (not shown) can be utilized to measure the erosion mean, erosion range, and roughness of the substantial continuous surface of the passivation layer. Further, the thickness of the passivation layer over the array region can be measured by measurement equipment.

The fabrication equipment 340 can be used to form the conductive features 260 shown in FIG. 4D. In some embodiments, the fabrication equipment 340 may include a tool performing the etching process to form openings of the passivation layer 250c over the array region 220 and a tool performing a sputter process or other suitable process to form conductive materials within the openings, thereby forming the conductive features.

The network 350 can be the internet or an intranet implementing network protocols such as transmission control protocol (TCP). Through the network 350, each piece of fabrication equipment 310, 320, 330, 340 and/or other measurement equipment may download or upload work in progress (WIP) information regarding to the wafer or the fabrication equipment from or to the controller 360.

The controller 360 can include a processer, such as a central processing unit (CPU), to collect offline or inline data of a wafer, thereby modify process conditions or recipes of fabrication equipment 310, 320, 330, 340.

Although FIG. 5A does not show any other fabrication equipment before the fabrication equipment 310, the exemplary embodiment is not intended to be limiting. In other exemplary embodiments, various kinds of fabrication equipment can be scheduled before the fabrication equipment 310, and can perform various processes according to the design requirement.

In the exemplary embodiments, a semiconductor device 301 and/or a semiconductor device 302 are transferred to the fabrication equipment 310 to start a sequence of different processes. The semiconductor device 301 and/or 302 may be processed by various stages forming at least one layer of material. The exemplary embodiments are not intended to limit the progress of the semiconductor device 301 and/or 302. In other exemplary embodiments, the semiconductor device 301 and/or 302 may include various layers, or any stages between the beginning and the completion of a product, before the semiconductor device 301 and/or 302 is transferred to the fabrication equipment 310. In the exemplary embodiments, the semiconductor device 301 and/or 302 can be processed by the fabrication equipment 310, 320, 330, and 340 in sequence.

Figure 5B:
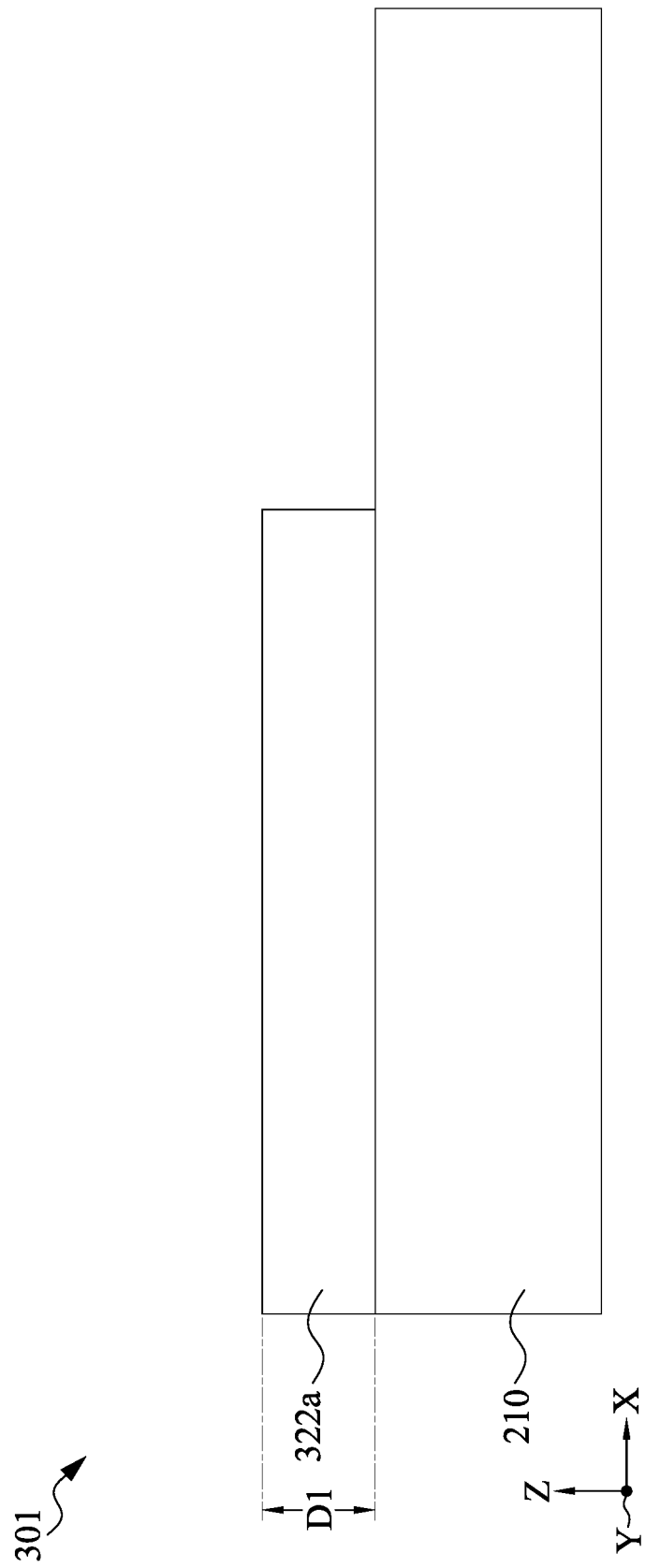
FIG. 5B is a cross-sectional view of a semiconductor device, in accordance with some embodiments of the present disclosure.
Figure 5C:
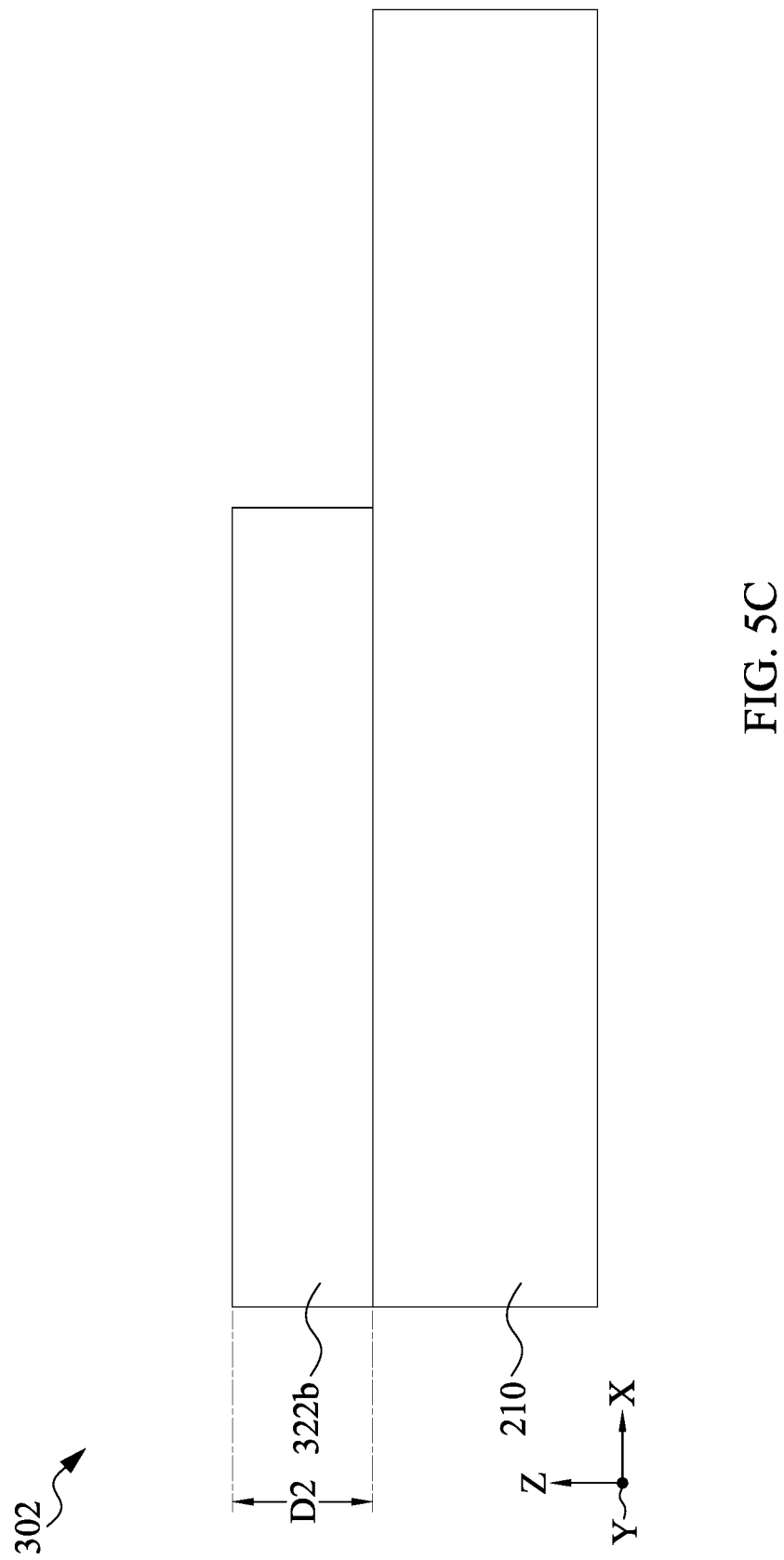
FIG. 5C is a cross-sectional view of a semiconductor device, in accordance with some embodiments of the present disclosure.

FIG. 5B and FIG. 5C are cross-sectional views of semiconductor devices 301 and 302, in accordance with some embodiments of the present disclosure. The semiconductor device 301 and/or 302 can also be referred to as a wafer, a carrier, or a semiconductor substrate. In some embodiments, the semiconductor devices 301 and 302 can be different products and have different thicknesses of the island structures over the array region. As shown in FIG. 5B and FIG. 5C, the semiconductor device 301 can have a thickness D1 of the island structure 322a, and the semiconductor device 302 can have a thickness D2 of the island structure 322b. In some embodiments, the thickness D2 can be different from the thickness D1.

As mentioned, since the thicknesses D1 and D2 of the island structures 322a and 322b can be predetermined respectively, the thicknesses of the passivation layer and the amount to be removed by the etching process can be determined. By aforesaid equations (1) to (7), a process condition that satisfies both the semiconductor devices 301 and 302 can be obtained. Thus, even though the semiconductor devices 301 and 302 are different products, the semiconductor devices 301 and 302 can be performed by the same processes with the same process conditions in the same fabrication equipment (e.g., 310, 320, 330, and/or 340). Thus, the performance of the fabrication equipment can be enhanced.

FIG. 6 is a diagram illustrating hardware of a semiconductor fabrication system 400, in accordance with various aspects of the present disclosure.

The processes illustrated in FIGS. 4A-4E may be implemented in the controller 360, or a computing system that organizes the fabrication of wafer by controlling every part or a portion of the fabrication equipment in the facility. FIG. 6 is a diagram illustrating hardware of a semiconductor fabrication system 400, in accordance with various aspects of the present disclosure. The system 400 includes one or more hardware processors 401 and a non-transitory computer readable storage medium 403 encoded with, for example, storing, program codes (i.e., a set of executable instructions.) The computer readable storage medium 403 may also be encoded with instructions for interfacing with fabrication equipment for producing the semiconductor device. The processor 401 is electrically coupled to the computer readable storage medium 403 via a bus 405. The processor 401 is also electrically coupled to an I/O interface 407 by the bus 405. A network interface 409 is also electrically connected to the processor 401 via the bus 405. The network interface is connected to a network, so that the processor 401 and the computer readable storage medium 403 are capable of connecting to external elements via network 350. The processor 401 is configured to execute the computer program code encoded in the computer readable storage medium 405 in order to cause the system 400 to be usable for performing a portion or all of the operations as described in the methods illustrated in FIGS. 4A-4E.

In some exemplary embodiments, the processor 401 can be, but is not limited to, a central processing unit (CPU), a multi-processor, a distributed processing system, an application specific integrated circuit (ASIC), and/or a suitable processing unit. Various circuits or units are within the contemplated scope of the present disclosure.

In some exemplary embodiments, the computer readable storage medium 403 can be, but is not limited to, an electronic, magnetic, optical, electromagnetic, infrared, and/or a semiconductor system (or apparatus or device). For example, the computer readable storage medium 403 includes a semiconductor or solid-state memory, a magnetic tape, a removable computer diskette, a random access memory (RAM), a read-only memory (ROM), a rigid magnetic disk, and/or an optical disk. In one or more exemplary embodiments using optical disks, the computer readable storage medium 403 also includes a compact disk-read only memory (CD-ROM), a compact disk-read/write (CD-R/W), and/or a digital video disc (DVD).

In some exemplary embodiments, the storage medium 403 stores computer program code configured to cause system 400 to perform methods illustrated in FIGS. 4A-4E. In one or more exemplary embodiments, the storage medium 401 also stores information needed for performing the methods illustrated in FIGS. 4A-4E as well as information generated during performing the methods and/or a set of executable instructions to perform the operation of methods illustrated in FIGS. 4A-4E. In some exemplary embodiments, a user interface 610, e.g., a graphical user interface (GUI), may be provided for a user to operate on the system 400.

In some exemplary embodiments, the storage medium 403 stores instructions for interfacing with external machines. The instructions enable processor 401 to generate instructions readable by the external machines to effectively implement the methods illustrated in FIGS. 4A-4E during analysis.

System 400 includes input and output (I/O) interface 407. The I/O interface 407 is coupled to external circuitry. In some exemplary embodiments, the I/O interface 407 can include, but is not limited to, a keyboard, keypad, mouse, trackball, track-pad, touch screen, and/or cursor direction keys for communicating information and commands to processor 401.

In some exemplary embodiments, the I/O interface 407 can include a display, such as a cathode ray tube (CRT), liquid crystal display (LCD), a speaker, and so on. For example, the display shows information.

System 400 can also include a network interface 409 coupled to the processor 401. The network interface 409 allows system 400 to communicate with network 350, to which one or more other computer systems are connected. For example, the system 400 may be connected to the fabrication equipment 310, 320, 330, and 340, exposure equipment, overlay measurement equipment 340, and overlay correction system 370 through the network interface 409 connecting to the network 350.

One aspect of the present disclosure provides a method for manufacturing a semiconductor device. The method includes providing a substrate comprising an array region and a peripheral region, wherein the array region and the peripheral region define a stepped structure, performing a deposition process to form a passivation layer over the array region and the peripheral region, performing an etching process to remove a portion of the passivation layer over the array region; and performing a chemical mechanical polishing process so that the passivation layer has a substantially continuous surface over the array region and the peripheral region.

Another aspect of the present disclosure provides a method for manufacturing a semiconductor device. The method includes: providing a substrate comprising an array region and a peripheral region, wherein the array region and the peripheral region define a stepped structure with a first height difference (H1), performing a deposition process to form a passivation layer over the peripheral region with a first thickness (T1) and over the array region with a second thickness (T2), performing a chemical mechanical polishing process to remove a portion of the passivation layer so that the passivation layer has a third thickness (T3) over the array region, wherein the H1, the T1, the T2, and the T3 satisfy an equation (1):

$$(T1-H1-T3)\times 3 < T2-T3 < (T1-H1-T3)\times 7.$$

Another aspect of the present disclosure provides a method for manufacturing a semiconductor device. The method includes: providing a substrate comprising an array region and a peripheral region, wherein the array region and the peripheral region define a stepped structure, performing a deposition process to form a passivation layer over the array region and the peripheral region, wherein the passivation layer has a first thickness (T1) over the peripheral region, and the T1 ranges from about 2000 nm to about 2800 nm, and performing a chemical mechanical polishing process so that the passivation layer has a substantially continuous surface over the array region and the peripheral region, wherein the substantially continuous surface of the passivation layer has a surface roughness with a maximum height less than about 80 nm.

The embodiments of the present disclosure provide a method of manufacturing a semiconductor device. The method includes forming a passivation over the array region and the peripheral region of a substrate. A chemical mechanical polishing process is performed to remove the passivation layer. The amount of the passivation layer removed by the chemical mechanical polishing process and the amount of the passivation layer deposited satisfy a specific equation. When process parameters satisfy the aforesaid equation, the uniformity of the substrate can be improved. Further, the polishing pad of chemical mechanical polishing process equipment can deteriorate at a much slower rate, reducing manufacturing costs.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, or steps.

What is claimed is:

1. A method for manufacturing a semiconductor device, comprising:
    providing a substrate comprising an array region and a peripheral region, wherein providing the substrate comprising:
    providing a base having the array region and a peripheral region, wherein a top surface of the array region and a top surface of the peripheral region are coplanar with each other; and
    forming an island structure on the top surface of the array region of the base to form a stepped structure, wherein a top surface of the island structure is positioned above the top surface of the peripheral region of the base;
    performing a deposition process to form a passivation layer over the base and the island structure, wherein the top surface of the island structure and the top surface of the peripheral region are covered by the passivation layer, wherein a thickness of the passivation layer above the array region is larger a thickness of the passivation layer above the peripheral region;
    performing an etching process to remove a portion of the passivation layer over the array region, wherein the portion of the passivation layer is removed from the top surface thereof to form a first remaining portion and a second remaining portion, such that a top surface of the first remaining portion is positioned below a top surface of the second remaining portion; and
    performing a chemical mechanical polishing process so that the passivation layer has a substantially continuous surface over the array region and the peripheral region, wherein after the chemical mechanical polishing process, the thickness of the passivation layer above the array region is less than the thickness of the passivation layer above the peripheral region.

2. The method of claim 1, wherein the passivation layer over the peripheral region is free from being removed by the etching process.

3. The method of claim 1, wherein the passivation layer over the array region defines a recess after performing the etching process, wherein the first remaining portion of the passivation layer is formed after the recess is formed.

4. The method of claim 3, wherein the stepped structure defines a first height difference between the top surface of the island structure and the top surface of the peripheral region, and the recess defines a second height difference between the top surface of the first remaining portion of the passivation layer and the top surface of the second remaining portion of the passivation layer, wherein the second height difference is greater than the first height difference.

5. The method of claim 4, wherein the deposition process forms the passivation layer with the thickness over the peripheral region, and the second height difference ranges from about 0.3 times to about 0.7 times of the thickness of the passivation layer above the peripheral region.

6. The method of claim 5, wherein, during the deposition process, the thickness of the passivation layer above the peripheral region ranges from about 2000 nm to about 2800 nm.

7. The method of claim 6, wherein after the substantially continuous surface of the passivation layer is formed, the thickness of the passivation layer above the array region ranges from about 200 nm to about 300 nm.

8. The method of claim 3, wherein a bottom surface of the recess is higher than the top surface of the passivation layer over the peripheral region, wherein the bottom surface of the recess is the top surface of the first remaining portion of the passivation layer.

9. The method of claim 3, wherein the recess is free from vertically overlapping the peripheral region, wherein the recess is free from vertically overlapping a lateral surface of the island structure.

10. The method of claim 1, wherein the etching process comprises a dry etching process.

11. The method of claim 1, further comprising:
    forming conductive vias within the passivation layer over the array region.

* * * * *